(12) United States Patent
Tanaka et al.

(10) Patent No.: US 7,038,247 B2
(45) Date of Patent: May 2, 2006

(54) LIGHT-EMITTING DEVICE WITH BUILT-IN MICROLENS AND METHOD OF FORMING THE SAME

(75) Inventors: Keiji Tanaka, Sapporo (JP); Masayuki Shono, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/636,736

(22) Filed: Aug. 8, 2003

(65) Prior Publication Data
US 2004/0028328 A1    Feb. 12, 2004

(30) Foreign Application Priority Data
Aug. 9, 2002 (JP) .............................. 2002-232374

(51) Int. Cl.
*H01L 29/22* (2006.01)
(52) U.S. Cl. ............................................ 257/98; 257/99
(58) Field of Classification Search ............... 257/98, 257/99, 100; 372/50, 101, 108, 49.01, 50.1, 372/50.23; 385/33, 74, 93
See application file for complete search history.

(56) References Cited

U.S. PATENT DOCUMENTS

| | | | | |
|---|---|---|---|---|
| 4,948,960 A | * | 8/1990 | Simms et al. | 250/227.11 |
| 6,253,004 B1 | * | 6/2001 | Lee et al. | 385/31 |
| 2001/0013924 A1 | * | 8/2001 | Yokoyama et al. | 353/52 |
| 2002/0085594 A1 | * | 7/2002 | Pezeshki et al. | 372/20 |
| 2003/0091084 A1 | * | 5/2003 | Sun et al. | 375/50 |

FOREIGN PATENT DOCUMENTS

JP    P2001-28456 A    1/2001

OTHER PUBLICATIONS

Hisakuni et al., "Optical Fabrication of Microlenses in Chalcogenide Glasses", Optics Letters/vol. 20, No. 9/May 1, 1995, pp. 958-960.

* cited by examiner

*Primary Examiner*—Minh-Loan Tran
(74) *Attorney, Agent, or Firm*—McDermott Will & Emery LLP

(57) ABSTRACT

A light-emitting device with a built-in microlens having a microlens integrated with a semiconductor light-emitting device causing no misalignment of an optical axis is provided. This light-emitting device with a built-in microlens comprises a semiconductor light-emitting device and a microlens, integrated with the semiconductor light-emitting device, formed through light emitted from the semiconductor light-emitting device. Thus, the optical axis of the microlens is automatically aligned in formation of the microlens.

14 Claims, 5 Drawing Sheets

LIGHT-EMITTING DEVICE WITH BUILT-IN MICROLENS AND METHOD OF FORMING THE SAME

BACKGROUND OF THE INVENTION

1. Field of the Invention

The present invention relates to a light-emitting device with a built-in microlens and a method of forming the same, and more specifically, it relates to a light-emitting device with a built-in microlens having a microlens integrated with a semiconductor light-emitting device and a method of forming the same.

2. Description of the Background Art

In general, a microlens having an aperture of about several 10 μm is known as an optical lens employed for an optical communication system. This microlens is employed in an optical communication system having a transmission medium of optical fiber for efficiently interconnecting optical components such as a semiconductor laser and an optical fiber member with each other.

When such a microlens is assembled with a light-emitting device such as a semiconductor laser, a microlens group manufactured independently of the light-emitting device is generally combined with the light-emitting device thereby obtaining necessary optical properties. When the light-emitting device and the microlens group are manufactured independently of each other, however, the light-emitting device is disadvantageously hard to miniaturize. Further, such combination of the microlens group and the light-emitting device inconveniently requires an optical axis adjusting step with precision of about 1 micron.

Therefore, Japanese Patent Laying-Open No. 2001-28456 or the like generally proposes a technique of forming a microlens integrated with a semiconductor light-emitting device. According to the technique proposed in this gazette, a cladding layer and a contact layer of the semiconductor light-emitting device are partially worked by lithography and etching thereby forming a Fresnel lens pattern (microlens). Thus, a Fresnel lens part (microlens) integrated with the semiconductor light-emitting device is so formed as to require no optical axis adjusting step and enable miniaturization.

In the structure proposed in the aforementioned gazette, however, the microlens is formed by partially working the cladding layer and the contact layer of the semiconductor light-emitting device by lithography and etching, and hence patterning misregistration may be caused in lithography. Such patterning misregistration may disadvantageously result misalignment of an optical axis.

SUMMARY OF THE INVENTION

An object of the present invention is to provide a light-emitting device with a built-in microlens having a microlens integrated with a light-emitting device causing no misalignment of an optical axis.

In order to attain the aforementioned object, a light-emitting device with a built-in microlens according to a first aspect of the present invention comprises a semiconductor light-emitting device and a microlens, integrated with the semiconductor light-emitting device, formed through light emitted from the semiconductor light-emitting device.

The light-emitting device with a built-in microlens according to the first aspect is provided with the microlens formed through the light emitted from the semiconductor light-emitting device as hereinabove described, whereby the optical axis of the microlens is automatically aligned in formation of the microlens so that the optical axis is not misaligned by patterning misregistration dissimilarly to a microlens formed by lithography and etching. Further, the microlens is so integrally provided with the semiconductor light-emitting device that an emission source can be miniaturized.

In the aforementioned light-emitting device with a built-in microlens according to the first aspect, the microlens preferably consists of a photosensitive material of either chalcogenide glass or photoreactive organic matter. According to this structure, the microlens can be easily formed by irradiating the aforementioned photosensitive material with the light emitted from the semiconductor light-emitting device.

In the aforementioned case, the chalcogenide glass may include an $As_2S_3$ film.

In the aforementioned case, the microlens may include a microlens having either a convex shape or a concave shape, or a graded index microlens.

In the aforementioned case, the microlens may be formed as a graded index microlens having a convex part.

In the aforementioned light-emitting device with a built-in microlens according to the first aspect, the microlens preferably has a function of substantially circularizing an elliptic emission spot from the semiconductor light-emitting device. According to this structure, light can be easily introduced into a cylindrical optical system such as an optical fiber member with the microlens in the semiconductor light-emitting device such as an edge emission laser having an elliptic emission spot.

In the aforementioned light-emitting device with a built-in microlens according to the first aspect, the semiconductor light-emitting device may have a plurality of emission parts, and the microlens may be formed for each of the plurality of emission parts.

The aforementioned light-emitting device with a built-in microlens according to the first aspect preferably further comprises a transparent insulating spacer provided between an emission surface of the semiconductor light-emitting device and the microlens. According to this structure, the distance between the emission surface of the semiconductor light-emitting device and the microlens can be varied by adjusting the thickness of the spacer, thereby varying imaging characteristics of the microlens. In this case, the spacer may include a $GeO_2$ film.

The aforementioned light-emitting device with a built-in microlens according to the first aspect preferably further comprises a first antireflection coating provided between an emission surface of the semiconductor light-emitting device and the microlens and a second antireflection coating provided on the surface of the microlens. According to this structure, the first and second antireflection coatings can prevent multiple reflection, whereby the characteristics of the microlens can be improved. In this case, the first antireflection coating and the second antireflection coating may include CdSe films.

In the aforementioned light-emitting device with a built-in microlens according to the first aspect, the microlens preferably includes a photo-irradiated part irradiated with the light emitted from the semiconductor light-emitting device, and the photo-irradiated part of the microlens preferably has a larger refractive index than the remaining part of the microlens. According to this structure, a graded index microlens having a photo-irradiated part exhibiting a larger refractive index than that of unirradiated part can be easily formed.

In the aforementioned light-emitting device according to the first aspect, the semiconductor light-emitting device preferably includes an edge emission semiconductor laser. According to this structure, an edge emission semiconductor laser with a built-in microlens inhibited from misalignment of an optical axis can be easily obtained.

A method of forming a light-emitting device with a built-in microlens according to a second aspect of the present invention comprises steps of forming a photosensitive material on an emission surface of a semiconductor light-emitting device and forming a microlens integrated with the semiconductor light-emitting device by irradiating the photosensitive material with light emitted from the semiconductor light-emitting device thereby reacting the photosensitive material.

In the method of forming a light-emitting device with a built-in microlens according to the second aspect, the microlens integrated with the semiconductor light-emitting device can be easily formed by forming the photosensitive material on the emission surface of the semiconductor light-emitting device and thereafter irradiating the photosensitive material with the light emitted from the semiconductor light-emitting device thereby reacting the photo-irradiated part of the photosensitive material. Consequently, an emission source can be miniaturized. The microlens is so formed through the light emitted from the semiconductor light-emitting device mounted with the microlens that the optical axis of the microlens is automatically aligned in formation of the microlens, whereby the optical axis is not misaligned by patterning misregistration dissimilarly to a microlens formed by lithography and etching.

In the aforementioned method of forming a light-emitting device with a built-in microlens according to the second aspect, the step of forming the microlens preferably includes a step of forming such a graded index microlens that the refractive index of a photo-irradiated portion of the photosensitive material is larger than the refractive index of the remaining unirradiated portion of the photosensitive material. According to this structure, the graded index microlens can be easily formed so that the photo-irradiated portion of the photosensitive material has a larger refractive index than that of unirradiated portion.

In the aforementioned method of forming a light-emitting device with a built-in microlens according to the second aspect, the step of forming the microlens preferably includes a step of forming a convex microlens by irradiating the photosensitive material with the light emitted from the semiconductor light-emitting device and thereafter etching a prescribed region of the photosensitive material. According to this structure, the portion irradiated with the light emitted from the semiconductor light-emitting device is hardly etched in response to the exposure, whereby an unirradiated portion and part of the irradiated portion of the photosensitive material are easily selectively etched. Thus, the convex microlens can be easily formed.

In the aforementioned method of forming a light-emitting device with a built-in microlens according to the second aspect, the step of forming the microlens preferably includes a step of forming a concave microlens by irradiating the photosensitive material with the light emitted from the semiconductor light-emitting device thereby evaporating the photosensitive material. According to this structure, the concave microlens consisting of the photosensitive material having a concavely evaporated portion can be easily formed.

The aforementioned method of forming a light-emitting device with a built-in microlens according to the second aspect preferably further comprises a step of performing heat treatment at a temperature around the glass transition temperature of the photosensitive material before irradiating the photosensitive material with the light emitted from the semiconductor light-emitting device, and the step of forming the microlens preferably includes a step of forming a graded index microlens having a convex shape by irradiating the photosensitive material with the light emitted from the semiconductor light-emitting device after the step of performing heat treatment. The heat treatment and photoirradiation are so performed that the refractive index of the portion of the photosensitive material irradiated with the light emitted from the semiconductor light-emitting device is increased while the volume is also simultaneously increased due to photoinduced volume expansion when this portion is irradiated with the light emitted from the semiconductor light-emitting device, whereby a protuberance is formed on the irradiated surface of the photosensitive material. Thus, the graded index microlens having a convex shape consisting of the photosensitive material having the protuberance on the irradiated surface can be easily formed.

The aforementioned method of forming a light-emitting device with a built-in microlens according to the second aspect preferably further comprises a step of forming a transparent insulating spacer on the emission surface of the semiconductor light-emitting device before forming the photosensitive material on the emission surface of the semiconductor light-emitting device. According to this structure, the distance between the emission surface of the semiconductor light-emitting device and the microlens can be varied by adjusting the thickness of the spacer, thereby varying imaging characteristics of the microlens.

The aforementioned method of forming a light-emitting device with a built-in microlens according to the second aspect preferably further comprises steps of forming a first antireflection coating on the emission surface of the semiconductor light-emitting device before forming the photosensitive material on the emission surface of the semiconductor light-emitting device and forming a second antireflection coating on the surface of the photosensitive material after forming the photosensitive material on the emission surface of the semiconductor light-emitting device. According to this structure, multiple reflection can be so prevented that the characteristics of the microlens can be improved.

In the aforementioned method of forming a light-emitting device with a built-in microlens according to the second aspect, the microlens preferably consists of a photosensitive material of either chalcogenide glass or photoreactive organic matter. According to this structure, the microlens can be easily formed by irradiating the aforementioned photosensitive material with the light emitted from the semiconductor light-emitting device.

A method of forming a light-emitting device with a built-in microlens according to a third aspect of the present invention comprises steps of arranging a photosensitive material in the vicinity of an emission surface of a semiconductor light-emitting device and forming a convex microlens integrated with the semiconductor light-emitting device by irradiating the photosensitive material with light emitted from the semiconductor light-emitting device thereby partially evaporating the photosensitive material.

In the method of forming a light-emitting device with a built-in microlens according to the third aspect, the microlens integrated with the semiconductor light-emitting device can be easily formed by arranging the photosensitive material in the vicinity of the emission surface of the semiconductor light-emitting device and thereafter irradiating the photosensitive material with the light emitted from the semiconductor light-emitting device thereby evaporating the photosensitive material. Consequently, an emission source can be miniaturized. Further, the microlens is so formed through the light emitted from the semiconductor light-emitting device mounted with the microlens that the optical axis of the microlens is automatically aligned in formation of the microlens, whereby the optical axis is not misaligned by patterning misregistration dissimilarly to a microlens formed by lithography and etching.

In the aforementioned method of forming a light-emitting device with a built-in microlens according to the third aspect, the microlens preferably consists of a photosensitive material of either chalcogenide glass or photoreactive organic matter. According to this structure, the microlens can be easily formed by irradiating the aforementioned photosensitive material with the light emitted from the semiconductor light-emitting device.

In the aforementioned method of forming a light-emitting device with a built-in microlens according to the second aspect, the step of forming the microlens may include a step of forming the microlens for each of a plurality of emission parts of the semiconductor light-emitting device having the plurality of emission parts.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
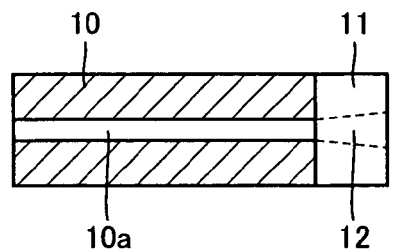
FIG. 1 is a sectional view showing the structure of a light-emitting device with a built-in microlens according to a first embodiment of the present invention.

In a light-emitting device with a built-in microlens according to a first embodiment of the present invention, a graded index microlens consisting of a chalcogenide glass film 11 is integrally formed on an emission edge of an edge emission semiconductor laser 10 having an emission layer 10a as shown in FIG. 1. The chalcogenide glass film 11 constituting the microlens consists of an $As_2S_3$ film having a thickness of about 4 µm and has a photo-irradiated part 12 having a larger refractive index than that of unirradiated part. The semiconductor laser 10 is an example of the "semiconductor light-emitting device" in the present invention, and the chalcogenide glass film 11 is an example of the "photosensitive material" in the present invention.

A method of forming the light-emitting device with a built-in microlens according to the first embodiment is now described with reference to FIGS. 2 to 4.

Figure 2:
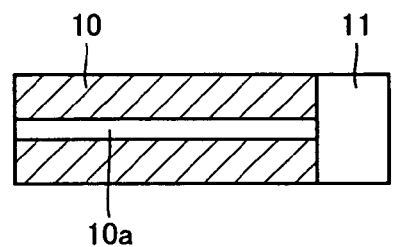
FIGS. 2 to 4 are sectional views for illustrating a process of forming the light-emitting device with a built-in microlens according to the first embodiment shown in FIG. 1.

First, the chalcogenide glass film 11 consisting of an $As_2S_3$ film is formed on a side edge of the edge emission semiconductor laser 10 with the thickness of about 4 µm, as shown in FIG. 2.

Figure 3:
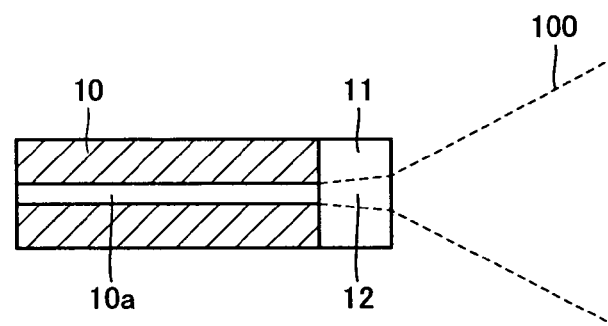
Figure 4:
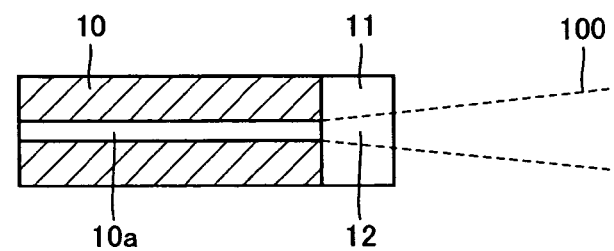

Thereafter the semiconductor laser 10 is so driven as to emit a laser beam 100 from the emission layer 10a, as shown in FIG. 3. More specifically, the semiconductor laser 10 irradiates the chalcogenide glass film 11 with the laser beam 100 of about 660 nm with power of about 50 mW for about 10 minutes. Thus, the refractive index of the photo-irradiated part 12 of the chalcogenide glass film 11 is increased due to photopolymerization and photoinduced refractive index change.

When the semiconductor laser 10 continuously irradiates the chalcogenide glass film 11 with the laser beam 100, the increasing change of the refractive index of the photo-irradiated part 12 of the chalcogenide glass film 11 is saturated. Thus, the graded index microlens consisting of the chalcogenide glass film 11 having the photo-irradiated part 12 exhibiting a larger refractive index than that of unirradiated part is formed as shown in FIG. 4.

According to the first embodiment, as hereinabove described, the laser beam 100 emitted from the semiconductor laser 10 is applied to the chalcogenide glass film 11 employed as a photosensitive material for increasing the refractive index of the photo-irradiated part 12 of the chalcogenide glass film 11 due to photopolymerization and photoinduced refractive index change, whereby the graded index microlens having the photo-irradiated part 12 exhibiting a larger refractive index than that of unirradiated part can be easily formed.

According to the first embodiment, further, the microlens consisting of the chalcogenide glass film 11 is formed through the laser beam 100 emitted from the semiconductor laser 10 mounted with the microlens so that the optical axis of the microlens is automatically aligned in formation of the microlens, whereby the optical axis is not misaligned by patterning misregistration dissimilarly to a microlens formed by lithography and etching.

According to the first embodiment, in addition, the chalcogenide glass film 11 is formed on the emission edge of the semiconductor laser 10 by vacuum deposition for thereafter forming the graded index microlens having the photo-irradiated part 12 exhibiting a larger refractive index than that of unirradiated part by photoirradiation from the semiconductor laser 10, whereby the microlens can be easily integrated with the semiconductor laser 10.

Figure 5:
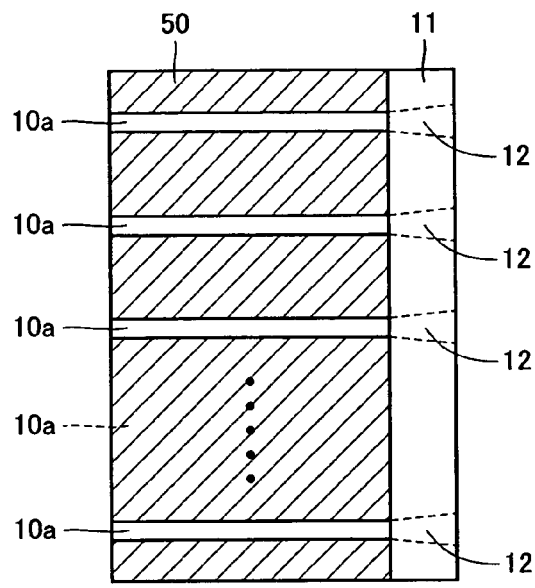
FIG. 5 is a sectional view of the light-emitting device with a built-in microlens according to the first embodiment, which is applied to a light-emitting device having a plurality of emission parts.

The semiconductor laser 10 may be formed by a multi-beam semiconductor laser having a plurality of emission parts or a semiconductor laser array. More specifically, a semiconductor laser 50 having a plurality of emission parts consisting of a plurality of emission layers 10a may be formed with a microlens consisting of a chalcogenide glass film 11 having a photo-irradiated part 12 exhibiting a larger refractive index than that of unirradiated part for each of the plurality of emission parts, as shown in FIG. 5. Further, the semiconductor laser 10 may also be formed by a multi-wavelength laser including a plurality of emission parts having different oscillation wavelengths, or a two-dimensional laser array employing an edge emission laser or the like. When the semiconductor laser 10 is formed by a multi-beam semiconductor laser or a semiconductor laser array, a multi-beam semiconductor laser or a semiconductor laser array with a built-in microlens can be easily prepared. In this case, the beam interval of the semiconductor laser 10 is preferably larger than about 10 μm, more preferably larger than about 15 μm, in order to prevent influence exerted by an adjacent laser beam on formation of the microlens. It is also possible to prepare a desired microlens every beam by varying the photosensitive material and the method of preparing the microlens with each beam.

(Second Embodiment)

Figure 6:
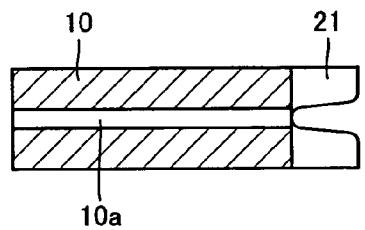
FIG. 6 is a sectional view showing the structure of a light-emitting device with a built-in microlens according to a second embodiment of the present invention.

Referring to FIG. 6, a chalcogenide glass film 21 constituting a microlens has a concave shape in a light-emitting device with a built-in microlens according to a second embodiment of the present invention. The chalcogenide glass film 21 is integrally formed on an emission surface of an edge emission semiconductor laser 10 having an emission layer 10a. This chalcogenide glass film 21 is an example of the "photosensitive material" in the present invention.

A method of forming the light-emitting device with a built-in microlens according to the second embodiment is now described with reference to FIGS. 7 and 8.

Figure 7:
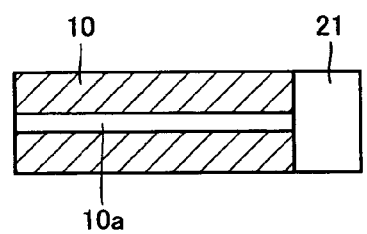
FIGS. 7 and 8 are sectional views for illustrating a process of forming the light-emitting device with a built-in microlens according to the second embodiment shown in FIG. 6.

First, the chalcogenide glass film 21 consisting of an $As_2S_3$ film having a thickness of about 50 μm is formed on the emission edge of the semiconductor laser 10, as shown in FIG. 7.

Figure 8:
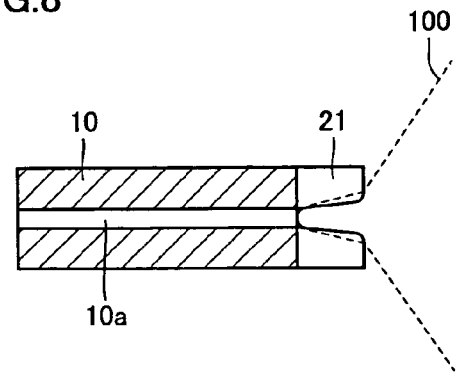

Then, the semiconductor laser 10 is driven under a condition increasing light intensity beyond that in the aforementioned embodiment, as shown in FIG. 8. More specifically, the semiconductor laser 10 emits a laser beam 100 of about 660 nm with power of about 100 mW for about 2 minutes. Thus, a portion of the chalcogenide glass film 21 irradiated with the laser beam 100 emitted from the semiconductor laser 10 is partially evaporated. Consequently, the microlens consisting of the chalcogenide glass film 21 having a concave shape is formed. Thus, the optical path length of the portion strongly irradiated with light is so reduced as to concavely form the microlens.

According to the second embodiment, as hereinabove described, the chalcogenide glass film 21 consisting of an $As_2S_3$ film is formed on the emission edge of the semiconductor laser 10, which in turn is driven under a condition increasing the intensity of the laser beam 100, whereby the concave microlens integrated with the semiconductor laser 10 can be easily formed.

According to the second embodiment, further, the microlens consisting of the concave chalcogenide glass film 21 is formed through the laser beam 100 emitted from the semiconductor laser 10 mounted with the microlens so that the optical axis of the microlens is automatically aligned in formation of the concave microlens, whereby the optical axis is not misaligned by patterning misregistration dissimilarly to a microlens formed by lithography and etching.

(Third Embodiment)

Figure 9:
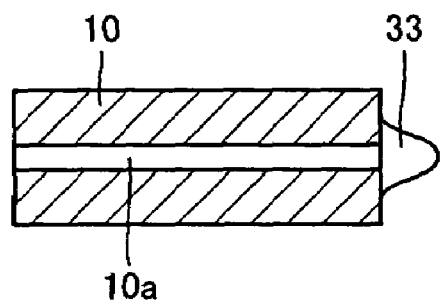
FIG. 9 is a sectional view showing the structure of a light-emitting device with a built-in microlens according to a third embodiment of the present invention.

Referring to FIG. 9, a microlens consisting of a convex chalcogenide glass film 33 is integrally formed on an emission edge of an edge emission semiconductor laser 10 having an emission layer 10a in a light-emitting device with a built-in microlens according to a third embodiment of the present invention. The chalcogenide glass film 33 is an example of the "photosensitive material" in the present invention.

A method of forming the light-emitting device with a built-in microlens according to the third embodiment is now described with reference to FIGS. 10 and 11.

Figure 10:
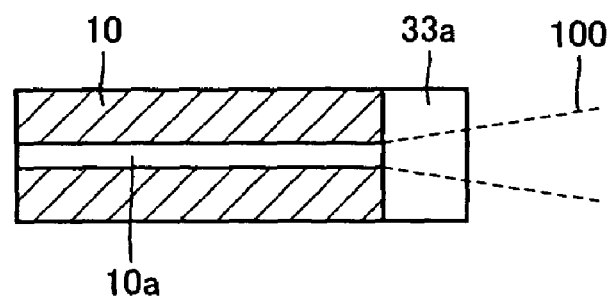
FIGS. 10 and 11 are sectional views for illustrating a process of forming the light-emitting device with a built-in microlens according to the third embodiment shown in FIG. 9.
Figure 11:
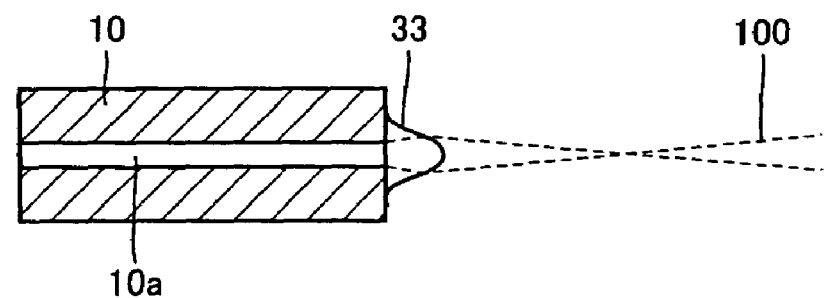

First, a chalcogenide glass film 33a consisting of an $As_2S_3$ film having a thickness of about 4 μm is formed on the emission edge of the semiconductor laser 10 by vacuum deposition, as shown in FIG. 10.

Thereafter the semiconductor laser 10 is driven under conditions similar to those in the formation process according to the first embodiment shown in FIG. 3, thereby irradiating the chalcogenide glass film 33a with a laser beam 100. More specifically, the semiconductor laser 10 applies the laser beam 100 of about 660 nm to the chalcogenide glass film 33a with power of about 50 mW for about 10 minutes. Thereafter an unirradiated portion and part of the irradiated portion of the chalcogenide glass film 33a are etched by wet etching employing an alkaline solution such as an NaOH aqueous solution or plasma etching with $SF_6$ or the like, for example. In this etching, the portion irradiated with the laser beam 100 is hardly etched in response to the exposure, to result in formation of the convex microlens consisting of the convex chalcogenide glass film 33 as shown in FIG. 11.

The convex shape of the microlens reflects intensity distribution of the laser beam 100 applied thereto. If the beam spot is elliptic, therefore, the convex microlens exhibits an elliptic shape (not shown). The elliptic convex microlens can substantially circularize the elliptic beam spot. More specifically, the convex microlens having an elliptic shape remarkably reduces the major axis direction of the elliptic beam spot while slightly reducing the minor axis direction thereof, whereby the beam spot can be substantially circularized.

According to the third embodiment, as hereinabove described, the convex microlens integrated with the semiconductor laser 10 can be easily formed by forming the chalcogenide glass film 33a consisting of an $As_2S_3$ film on the emission surface of the semiconductor laser 10 by vacuum deposition and thereafter forming the convex microlens by photoirradiation from the semiconductor laser 10 and etching.

According to the third embodiment, further, the optical axis of the microlens is automatically aligned in formation of the microlens by forming the microlens consisting of the chalcogenide glass film 33a through the laser beam 100 emitted from the semiconductor laser 10 mounted with the microlens, whereby the optical axis is not misaligned by patterning misregistration dissimilarly to a microlens formed by lithography and etching.

According to the third embodiment, in addition, a convex shape can be formed with a portion intensely irradiated with the laser beam 100 having a large optical path length, whereby a beam can be formed with small aberration. Thus, coupling efficiency of the laser beam 100 emitted from the semiconductor laser 10 can be improved with respect to an optical fiber member or the like.

(Fourth Embodiment)

Figure 12:
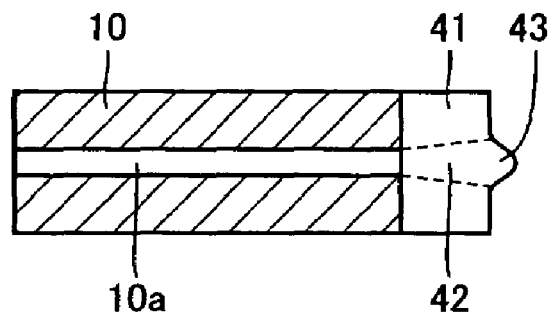
FIG. 12 is a sectional view showing the structure of a light-emitting device with a built-in microlens according to a fourth embodiment of the present invention.

Referring to FIG. 12, a microlens consisting of a chalcogenide glass film 41 having a photo-irradiated part 42 exhibiting a larger refractive index than that of unirradiated part and a convex part 43 is integrally formed on an emission edge of an edge emission semiconductor laser 10 in a light-emitting device with a built-in microlens according to a fourth embodiment of the present invention. The chalcogenide glass film 41 consists of an $As_2S_3$ film having a thickness of about 4 μm. This chalcogenide glass film 41 is an example of the "photosensitive material" in the present invention.

A method of forming the light-emitting device with a built-in microlens according to the fourth embodiment shown in FIG. 12 is now described with reference to FIGS. 13 and 14.

Figure 13:
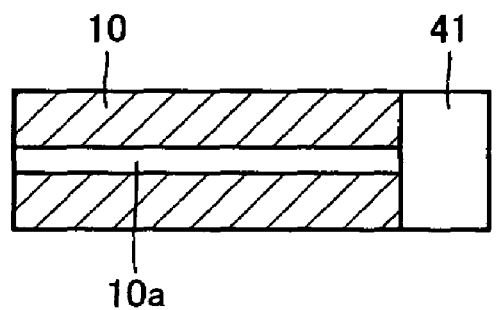
FIGS. 13 and 14 are sectional views for illustrating a process of forming the light-emitting device with a built-in microlens according to the fourth embodiment shown in FIG. 12.
Figure 14:
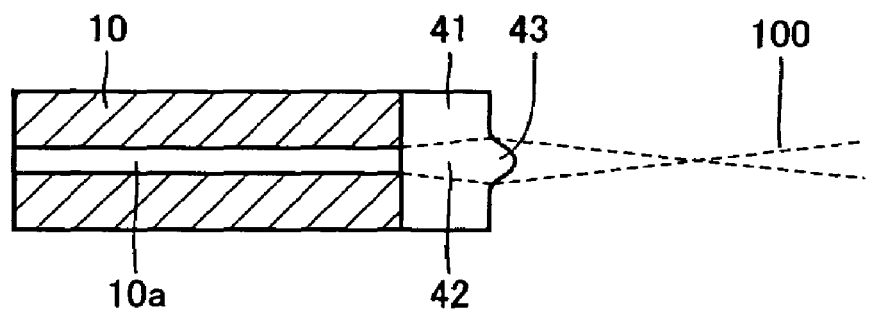

As shown in FIG. 13, the chalcogenide glass film 41 consisting of an $As_2S_3$ film having the thickness of about 4 μm is formed on the emission edge of the semiconductor laser 10. Thereafter heat treatment is performed at a temperature close to the glass transition temperature (about 180° C. to about 220° C.) of the $As_2S_3$ film. More specifically, the heat treatment is performed at a temperature of about 180° C. for about 1 hour. Thereafter the semiconductor laser 10 is driven to apply a laser beam 100 of about 660 nm to the chalcogenide glass film 41 with power of about 50 mW for about 1 hour, as shown in FIG. 14. Thus, the refractive index of the photo-irradiated part 42 is increased due to photoinduced refractive index change while the volume is also simultaneously increased due to photoinduced volume expansion. In other words, expansional deformation of the photo-irradiated part 42 irradiated with the laser beam 100, starting to expand due to the photoinduced volume expansion, is restricted by the outer peripheral portion of the photo-irradiated part 42 not influenced by the photoinduced volume expansion. Therefore, the photo-irradiated part 42 starting to expand is stressed, to form a protuberance (convex part 43) on the free surface portion for relaxing the stress. Consequently, the convex microlens consisting of the chalcogenide glass film 41 is formed to have the photo-irradiated part 42 exhibiting a larger refractive index than that of unirradiated part and the convex part 43.

According to the fourth embodiment, as hereinabove described, the graded index microlens having a convex shape integrated with the semiconductor laser 10 can be easily formed by vacuum-depositing the chalcogenide glass film 41, heat-treating the same at a temperature close to the glass transition temperature thereof and applying the laser beam 100 from the semiconductor laser 10 thereto.

According to the fourth embodiment, further, the optical axis of the microlens is automatically aligned in formation of the microlens by forming the graded index microlens having a convex shape through light emitted from the semiconductor laser 10 mounted with the microlens, whereby the optical axis is not misaligned by patterning misregistration dissimilarly to a microlens formed by lithography and etching.

According to the fourth embodiment, in addition, a convex shape can be formed with a portion intensely irradiated with light having a large optical path length whereby a beam can be formed with small aberration. Thus, the coupling efficiency of the laser beam 100 emitted from the semiconductor laser 10 can be improved with respect to an optical fiber member or the like.

(Fifth Embodiment)

Figure 15:
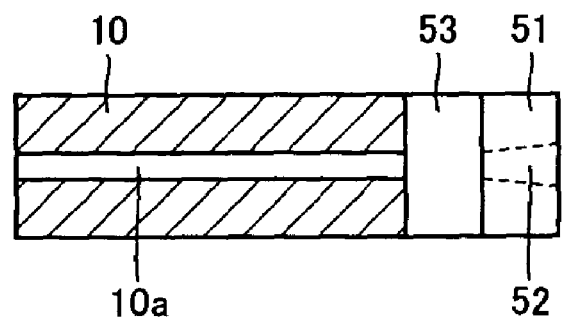
FIG. 15 is a sectional view showing the structure of a light-emitting device with a built-in microlens according to a fifth embodiment of the present invention.

Referring to FIG. 15, a light-emitting device with a built-in microlens according to a fifth embodiment of the present invention has a structure obtained by adding a transparent insulating spacer 53 between a semiconductor laser 10 and a microlens in a structure similar to that of the first embodiment shown in FIG. 1.

In the light-emitting device with a built-in microlens according to the fifth embodiment, a graded index microlens consisting of a chalcogenide glass film 51 having a photo-irradiated part 52 exhibiting a larger refractive index than that of unirradiated part is integrally formed on an emission edge of the edge emission semiconductor laser 10 having an emission layer 10a through the transparent insulating spacer 53, as shown in FIG. 15. The spacer 53 consists of a $GeO_2$ film formed by high-frequency sputtering, for example, and has a thickness of about 5 μm to about 100 μm. The chalcogenide glass film 51 constituting the microlens consists of an $As_2S_3$ film having a thickness of about 4 μm. The chalcogenide glass film 51 is an example of the "photosensitive material" in the present invention.

According to the fifth embodiment, as hereinabove described, the transparent insulating spacer 53 is provided between the semiconductor laser 10 and the chalcogenide glass film 51 so that the distance between a beam spot position on the emission edge of the semiconductor laser 10 and the chalcogenide glass film 51 can be varied by adjusting the thickness of the spacer 53, thereby varying imaging characteristics of the microlens. The insulating spacer 53 can alternatively be formed by air. For example, chalcogenide glass may be bonded to a window member of a laser cover for mounting a microlens on the bonded chalcogenide glass.

The remaining effects of the fifth embodiment are similar to those of the aforementioned first embodiment.

(Sixth Embodiment)

Figure 16:
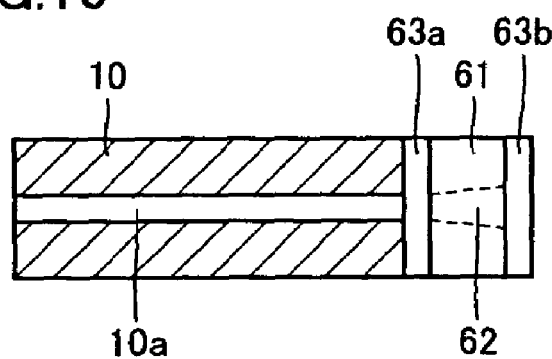
FIG. 16 is a sectional view showing the structure of a light-emitting device with a built-in microlens according to a sixth embodiment of the present invention.

Referring to FIG. 16, a light-emitting device with a built-in microlens according to a sixth embodiment of the present invention has a structure obtained by adding antireflection coatings 63a and 63b to a structure similar to that according to the first embodiment shown in FIG. 1.

According to the sixth embodiment, the antireflection coatings 63a and 63b are formed between an emission edge of an edge emission semiconductor laser 10 having an emission layer 10a and a chalcogenide glass film 61 and on the surface of the chalcogenide glass film 61 respectively, as shown in FIG. 16. The antireflection coatings 63a and 63b are formed by CdSe films of about 100 nm in thickness formed by high-frequency sputtering. According to the sixth embodiment, the chalcogenide glass film 61 is so formed as to increase the refractive index of a photo-irradiated part 62, thereby forming a graded index microlens having the photo-irradiated part 62 exhibiting a larger refractive index than that of unirradiated part. The chalcogenide glass film 61 is an example of the "photosensitive material" in the present invention. The antireflection coatings 63a and 63b are examples of the "first antireflection coating" and the "second antireflection coating" in the present invention respectively.

According to the sixth embodiment, as hereinabove described, the antireflection coatings 63a and 63b are so provided that the light-emitting device can be prevented from multiple reflection, whereby the characteristics of the microlens consisting of the chalcogenide glass film 61 can be improved.

In a process of forming the aforementioned light-emitting device with a built-in microlens according to the sixth embodiment, the antireflection coating 63a, the chalcogenide glass film 61 and the antireflection coating 63b are successively formed on the edge of the semiconductor laser 10 emitting light, for thereafter applying a laser beam 100 of about 660 nm to the chalcogenide glass film 61 with power of about 50 mW for about 10 minutes, similarly to the process of forming the light-emitting device with a built-in microlens according to the first embodiment shown in FIG. 3. Thus, the graded index microlens is formed with the photo-irradiated part 62 having a larger refractive index than that of unirradiated part, as shown in FIG. 16.

Also in the sixth embodiment, the optical axis of the microlens is automatically aligned in formation of the microlens by forming the microlens through light emitted from the semiconductor laser 10 mounted with the microlens similarly to the aforementioned first to fifth embodiments, whereby the optical axis is not misaligned by patterning misregistration dissimilarly to a microlens formed by lithography an etching.

Further, the microlens integrated with the semiconductor laser 10 can be easily formed by successively forming the antireflection coating 63a, the chalcogenide glass film 61 and the antireflection coating 63b on the emission edge of the semiconductor laser 10 and thereafter applying light from the semiconductor laser 10 to the chalcogenide glass film 61.

(Seventh Embodiment)

Figure 17:
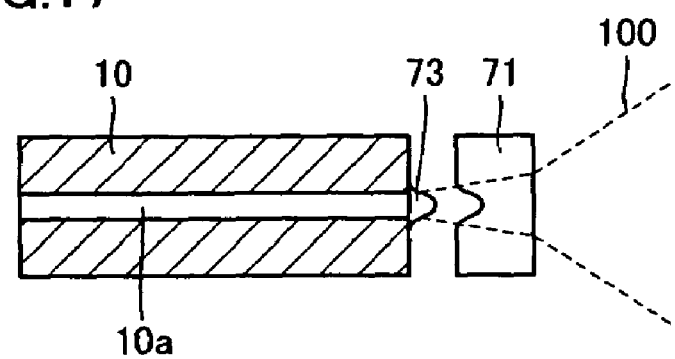
FIG. 17 is a sectional view for illustrating a process of forming the light-emitting device with a built-in microlens according to the seventh embodiment of the present invention.

Referring to FIG. 17, a microlens consisting of a chalcogenide glass film 73 integrated with a semiconductor laser 10 is formed through a process basically different from those of the aforementioned first to sixth embodiments in a light-emitting device with a built-in microlens according to a seventh embodiment of the present invention. The chalcogenide glass film 73 is an example of the "photosensitive material" in the present invention.

More specifically, a chalcogenide glass film 71 is arranged in proximity to an emission edge of a semiconductor laser 10 at an interval of about 1 µm to about 10 µm from the emission edge, as shown in FIG. 17. In this state, the semiconductor laser 10 is driven to apply a laser beam 100 to the chalcogenide glass film 71. More specifically, the semiconductor laser 10 applies the laser beam 100 of about 660 nm to the chalcogenide glass film 71 with power of about 100 mW for about 2 minutes. Thus, the portion of the chalcogenide glass film 71 irradiated with the laser beam 100 is evaporated to convexly adhere to the emission edge of the semiconductor laser 10. Thereafter the chalcogenide glass film 71 is so removed that the convex chalcogenide glass film 73 operates as a convex microlens.

According to the seventh embodiment, as hereinabove described, the convex microlens integrated with the semiconductor laser 10 can be easily formed by arranging the chalcogenide glass film 71 in proximity to the emission edge of the semiconductor laser 10 and thereafter applying the laser beam 100 emitted from the semiconductor laser 10 to the chalcogenide glass film 71 thereby partially evaporating the chalcogenide glass film 71.

Also in the seventh embodiment, the optical axis of the microlens is automatically aligned in formation of the microlens by forming the microlens through the laser beam 100 emitted from the semiconductor laser 10 mounted with the microlens, whereby the optical axis is not misaligned by patterning misregistration dissimilarly to a microlens formed by lithography and etching.

According to the seventh embodiment, further, a convex shape can be formed with a portion intensely irradiated with light having a large optical path length, whereby a beam can be formed with small aberration. Thus, the coupling efficiency of the laser beam 100 emitted from the semiconductor laser 10 can be improved with respect to an optical fiber member or the like.

Although the present invention has been described and illustrated in detail, it is clearly understood that the same is by way of illustration and example only and is not to be taken by way of limitation, the spirit and scope of the present invention being limited only by the terms of the appended claims.

For example, while each of the above embodiments has been described with reference to the microlens formed on the emission edge of the edge emission semiconductor laser employed as an exemplary semiconductor light-emitting device, the present invention is not restricted to this but is also applicable to a microlens formed on an emission surface of another semiconductor light-emitting device such as a surface emission semiconductor laser or a light-emitting diode.

While each of the aforementioned embodiments employs the chalcogenide glass film consisting of $As_2S_3$ as the photosensitive material for forming the microlens, the present invention is not restricted to this but similar effects can also be attained by employing a chalcogenide glass film consisting of another material or a photosensitive material consisting of photoreactive organic matter, for example. More specifically, it is preferable to employ $As_2S_3$ or $GeSe_2$ for a red laser, $As_2Se_3$ or the like for an infrared laser, or $GeS_2$ or the like for a blue-green laser. Photoreactive organic matter such as micro-negative resist (by Eastman Kodak Co.) or photoresist is preferably employed for an ultraviolet laser.

While the graded index microlens having a concave shape integrated with the semiconductor laser 10 is formed by vacuum-depositing the chalcogenide glass film 41, thereafter performing heat treatment at the temperature close to the glass transition temperature thereof and irradiating the chalcogenide glass film 41 with the light emitted from the semiconductor laser 10 in the aforementioned fourth embodiment, the present invention is not restricted to this but a graded index microlens having a convex shape integrated with a semiconductor laser similar to that according to the fourth embodiment can also be formed by forming a chalcogenide glass film by high-frequency sputtering and thereafter applying a laser beam from a semiconductor laser to the chalcogenide glass film under conditions similar to those in the fourth embodiment.

While the light-emitting device with a built-in microlens according to the aforementioned fifth embodiment has the structure obtained by adding the transparent insulating spacer 53 to the structure similar to that according to the first embodiment, the present invention is not restricted to this but the spacer 53 may alternatively be added to a structure similar to that according to any of the second to fourth and sixth and seventh embodiments. Also in this case, the distance between the beam spot position on the emission edge of the semiconductor laser 10 and the chalcogenide glass film 21, 33, 41, 61 or 73 can be varied by adjusting the thickness of the spacer 53, thereby varying imaging characteristics of the microlens.

While the fifth embodiment has been described with reference to the spacer 53 formed by a $GeO_2$ film, the present invention is not restricted to this but another transparent film or air may alternatively be employed. When air is employed as the spacer 53, the microlens is mechanically fixed to the periphery of the emission part of the semiconductor laser 10.

While the antireflection coatings 63a and 63b are added to the structure similar to that according to the first embodiment in the aforementioned sixth embodiment, the present invention is not restricted to this but the antireflection coatings 63a and 63b may alternatively be added to a structure similar to that of any of the second to fifth embodiments and the seventh embodiment. Also in this case, multiple reflection can be so suppressed that the characteristics of the microlens can be improved.

While the antireflection coatings 63a and 63b consist of $GeO_2$ films in the aforementioned sixth embodiment, the present invention is not restricted to this but the antireflection coatings 63a and 63b may alternatively be formed by other films of $SiO_2$, SiN, $TiO_2$ or the like having antireflection functions.

What is claimed is:

1. A light-emitting device with a built-in microlens comprising:
   a semiconductor light-emitting device; and
   a microlens, integrated with said semiconductor light-emitting device, formed through light emitted from said semiconductor light-emitting device, wherein
   said microlens is formed by irradiating a photosensitive material with light emitted from the semiconductor light-emitting device thereby reacting the photosensitive material after forming the photosensitive material on an emission surface of the semiconductor light-emitting device.

2. The light-emitting device with a built-in microlens according to claim 1, wherein
   said microlens consists of a photosensitive material of either chalcogenide glass or photoreactive organic matter.

3. The light-emitting device with a built-in microlens according to claim 2, wherein said chalcogenide glass includes an $As_2S_3$ film.

4. The light-emitting device with a built-in microlens according to claim 1, wherein
   said microlens includes a microlens having either a convex shape or a concave shape.

5. The light-emitting device according to claim 1, wherein said microlens includes a graded index microlens.

6. The light-emitting device with a built-in microlens according to claim 5, wherein
   said microlens is a graded index microlens having a convex part.

7. The light-emitting device with a built-in microlens according to claim 1, wherein
   said microlens has a function of substantially circularizing an elliptic emission spot from said semiconductor light-emitting device.

8. The light-emitting device with a built-in microlens according to claim 1, wherein
   said semiconductor light-emitting device has a plurality of emission parts, and said microlens is formed for each of said plurality of emission parts.

9. The light-emitting device with a built-in microlens according to claim 1, further comprising a transparent insulating spacer provided between an emission surface of said semiconductor light-emitting device and said microlens.

10. The light-emitting device with a built-in microlens according to claim 9, wherein said spacer includes a $GeO_2$ film.

11. The light-emitting device with a built-in microlens according to claim 1, further comprising:
    a first antireflection coating provided between an emission surface of said semiconductor. light-emitting device and said microlens, and
    a second antireflection coating provided on the surface of said microlens.

12. The light-emitting device with a built-in microlens according to claim 11, wherein
    said first antireflection coating and said second antireflection coating include CdSe films.

13. The light-emitting device with a built-in microlens according to claim 1, wherein
    said microlens includes a photo-irradiated part irradiated with said light emitted from said semiconductor light-emitting device, and
    said photo-irradiated part of said microlens has a larger refractive index than the remaining part of said microlens.

14. The light-emitting device according to claim 1, wherein
    said semiconductor light-emitting device includes an edge emission semiconductor laser.

* * * * *